United States Patent
Kato et al.

(10) Patent No.: US 6,710,256 B2
(45) Date of Patent: Mar. 23, 2004

(54) APPARATUS FOR CONNECTING HIGH-FREQUENCY CIRCUIT BOARDS PROVIDED WITH CONNECTING ELECTRODES FORMED ON BAR-SHAPED MEMBER

(75) Inventors: Kenichi Kato, Kobe (JP); Hiroaki Ugawa, Kobe (JP); Toshiki Kita, Kobe (JP)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/957,432

(22) Filed: Sep. 20, 2001

(65) Prior Publication Data

US 2002/0074157 A1 Jun. 20, 2002

(30) Foreign Application Priority Data

Dec. 6, 2000 (JP) ........................... 2000-371311

(51) Int. Cl.$^7$ ................................. H05K 1/03
(52) U.S. Cl. ................. 174/255; 174/261; 361/732; 361/747; 361/759; 439/62
(58) Field of Search ............... 174/254, 255, 174/261; 361/732, 733, 747, 759; 206/706; 439/38, 62, 950

(56) References Cited

U.S. PATENT DOCUMENTS

| | | | | |
|---|---|---|---|---|
| 3,579,206 A | * | 5/1971 | Grange | 365/160 |
| 4,479,686 A | * | 10/1984 | Hoshino et al. | 439/78 |
| 4,509,206 A | * | 4/1985 | Carpe et al. | 455/234.2 |
| 5,470,240 A | * | 11/1995 | Suzuki | 439/157 |
| 5,673,182 A | * | 9/1997 | Garner | 361/829 |
| 6,007,357 A | * | 12/1999 | Perino et al. | 439/327 |
| 6,102,710 A | * | 8/2000 | Beilin et al. | 439/67 |

OTHER PUBLICATIONS

Microstrip Lines and Slotlines, K. C. Gupta, Tmesh Garg, and I.J. Bahl, Artech House, Inc., 1979, Capter 1 and Chapter 7.
Hewlett Packard, E5022A Hard Disk Read/Write System Operation Manual, Jan. 23, 1998, p. 27.

* cited by examiner

Primary Examiner—Kamand Cuneo
Assistant Examiner—Jose H. Alcala

(57) ABSTRACT

An apparatus and a method for connecting high-frequency circuit boards, and for providing an electrical connection between respective electrodes of two high-frequency circuit boards includes an electrode connecting member including a bar-shaped member having a predetermined sectional shape, and having connecting electrodes formed on a part of an outer periphery of the bar-shaped member. The connecting electrodes are located so as to provide an interconnection between the respective electrodes of the two high-frequency circuit boards through the connecting electrodes and to be sandwiched between the respective electrodes thereof. The connecting electrodes are preferably composed of a plurality of electrode lines formed so as to be spaced at a predetermined interval on the outer periphery of the bar-shaped member.

9 Claims, 7 Drawing Sheets

CROSS SECTION TAKEN ALONG LINE A-A'

CROSS SECTION TAKEN ALONG LINE A-A'

CROSS SECTION TAKEN ALONG LINE B-B'
(EXCLUDING POSITIONING BAR 44)

FIRST MODIFIED PREFERRED EMBODIMENT

CROSS SECTION TAKEN ALONG LINE C-C' (EXCLUDING POSITIONING PROJECTION 12 AND POSITIONING BAR 43)

CROSS SECTION TAKEN ALONG LINE D-D' (EXCLUDING POSITIONING BAR 44)

SECOND MODIFIED PREFERRED EMBODIMENT

CROSS SECTION TAKEN ALONG LINE E-E' (EXCLUDING POSITIONING PROJECTION 12 AND POSITIONING BAR 43)

CROSS SECTION TAKEN ALONG LINE F-F' (EXCLUDING POSITIONING BAR 44)

APPARATUS FOR CONNECTING HIGH-FREQUENCY CIRCUIT BOARDS PROVIDED WITH CONNECTING ELECTRODES FORMED ON BAR-SHAPED MEMBER

BACKGROUND OF THE INVENTION

1. Field of the Invention

The present invention relates to a connecting apparatus and method for providing electrical connection between respective electrodes of two high-frequency circuit boards, and in particular, to a connecting apparatus and method for providing electrical connection between respective electrodes of two high-frequency circuit boards for use in bands of frequencies such as microwave frequencies, sub-millimeter wave frequencies, millimeter wave frequencies or the like.

2. Description of the Related Art

FIG. 7 is an exploded perspective view showing a configuration of a connecting apparatus of a prior art for providing electrical connection between respective electrodes 11 and 21 of two high-frequency circuit boards 10 and 20. FIG. 8 is a cross sectional view taken along the line G–G' of FIG. 7. FIG. 9 is a cross sectional view taken along the line H–H' of FIG. 8.

In the prior art shown in FIGS. 7 to 9, the electrodes 11 of one high-frequency circuit board 10 are brought into contact with electrode connecting parts 21t (generally called pads) of the electrodes 21 formed on another high-frequency circuit board 20 through contact probes 90 (generally called pogo pins) which are soldered to electrode connecting parts 11t of the electrodes 11 or fitted into through holes 11h of the electrode connecting parts 11t (generally called pads) by means of inserting with pressing or the like, and this leads to that the electrodes 11 and 21 are made to be electrically connected with each other. In the prior art, each of the high-frequency circuit boards 10 and 20 is, for example, made of a hard dielectric board or an FPC (flexible printed wiring board).

However, a mismatch between characteristic impedances occurs in the contact probes 90 when the electrodes 11 and 21 of the two high-frequency circuit boards 10 and 20 are electrically connected with each other by means of the contact probes 90 which are so-called pogo pins. In this case, there are the following problems. Namely, not only point contacts but also repeated contacting would cause wearing away of the tips of the contact probes 90, the contact probes 90 and the electrode connecting parts 11t and 21t, and this leads to deterioration in DC (direct current) characteristics and high-frequency characteristics at an early stage, which results in unsatisfactory longevity.

Moreover, each center pin is singly replaceable in the contact probe 90, however, the whole high-frequency circuit boards 10 and 20 must be replaced with another ones in the electrode connecting parts 11t and 21t. Therefore, when expensive parts are mounted on the circuit boards 10 and 20, the circuit boards 10 and 20 become expensive, and then, the repairing cost become higher.

Furthermore, structural design is limited due to the influence of the size and shape of the contact probe 90. That is, the following problems exist:

(1) the connecting electrodes cannot be arranged with a smaller pitch due to a diameter of the contact probe 90 and the through holes 11h formed in the high-frequency circuit board 10; and (2) an arrangement of components cannot be provided on a back surface of the high-frequency circuit board 10 since the contact probes 90 must be fitted in and pass through the high-frequency circuit board 10, and an unnecessary space must be provided since the contact probes 90 projects through the back surface of the high-frequency circuit board 10.

SUMMARY OF THE INVENTION

It is an essential object of the present invention to solve the above-mentioned problems and to provide an apparatus and a method for connecting high-frequency circuit boards, which achieve less deterioration in high-frequency characteristics, a simpler structure, a smaller size, a lighter weight, a longer life and more inexpensiveness as compared with those of the prior art.

In order to achieve the aforementioned objective, according to one aspect of the present invention, there is provided an apparatus for connecting high-frequency circuit boards, for providing electrical connection between respective electrodes of two high-frequency circuit boards, comprising:

an electrode connecting member including a bar-shaped member having a predetermined sectional shape, and including connecting electrode means formed on a part of an outer periphery of the bar-shaped member, wherein the connecting electrode means is located so as to provide inter-connection between the respective electrodes of the two high-frequency circuit boards through the connecting electrode means and to be sandwiched between the respective electrodes thereof.

In the above-mentioned apparatus, the connecting electrode means preferably comprises a plurality of electrode lines formed so as to be spaced at a predetermined interval on the outer periphery of the bar-shaped member. Alternatively, in the above-mentioned apparatus, the connecting electrode means preferably comprises a plurality of sets of connecting electrodes, respective sets of connecting electrodes are formed on the outer periphery of the bar-shaped member so as to be spaced at a predetermined first interval corresponding to an interval between the respective electrodes of each of the two high-frequency circuit boards, and each set of connecting electrodes is formed of a plurality of electrode lines which are spaced at a predetermined second interval smaller than the first interval on the outer periphery of the bar-shaped member. Further alternatively, in the above-mentioned apparatus, the connecting electrode means preferably comprises a plurality of planer solid electrodes which are formed on the outer periphery of the bar-shaped member so as to be spaced at a predetermined first interval corresponding to an interval between the respective electrodes of each of the two high-frequency circuit boards.

The above-mentioned apparatus preferably further comprises a positioning member for positioning the electrode connecting member between the two high-frequency circuit boards so that the connecting electrode means provides inter-connection between the respective electrodes of the two high-frequency circuit boards so as to be sandwiched between the respective electrodes thereof.

In the above-mentioned apparatus, the plurality of electrode lines is preferably arranged to comprise a structure of coplanar line.

According to another aspect of the present invention, there is provided a method for connecting high-frequency circuit boards, for providing electrical connection between respective electrodes of two high-frequency circuit boards, the method including the step of locating connecting electrode means so as to provide inter-connection between the respective electrodes of the two high-frequency circuit boards through the connecting electrode means and to be sandwiched between the respective electrodes thereof, by means of an electrode connecting member including a bar-shaped member having a predetermined sectional shape, and including the connecting electrode means formed on a part of an outer periphery of the bar-shaped member.

In the above-mentioned method, the connecting electrode means preferably comprises a plurality of electrode lines formed so as to be spaced at a predetermined interval on the outer periphery of the bar-shaped member. Alternatively, in the above-mentioned method, the connecting electrode means preferably comprises a plurality of sets of connecting electrodes, respective sets of connecting electrodes are formed on the outer periphery of the bar-shaped member so as to be spaced at a predetermined first interval corresponding to an interval between the respective electrodes of each of the two high-frequency circuit boards, and each set of connecting electrodes is formed of a plurality of electrode lines which are spaced at a predetermined second interval smaller than the first interval on the outer periphery of the bar-shaped member. Further alternatively, in the above-mentioned method, the connecting electrode means preferably comprises a plurality of planer solid electrodes which are formed on the outer periphery of the bar-shaped member so as to be spaced at a predetermined first interval corresponding to an interval between the respective electrodes of each of the two high-frequency circuit boards.

The above-mentioned method preferably further includes positioning the electrode connecting member between the two high-frequency circuit boards, by means of a positioning member.

BRIEF DESCRIPTION OF THE DRAWINGS

These and other objects and features of the present invention will become clear from the following description taken in conjunction with the preferred embodiments thereof with reference to the accompanying drawings throughout which like parts are designated by like reference numerals, and in which.

DETAILED DESCRIPTION OF THE PREFERRED EMBODIMENTS

Preferred embodiments of the present invention will be described below with reference to the drawings.

Preferred Embodiment

Figure 1:
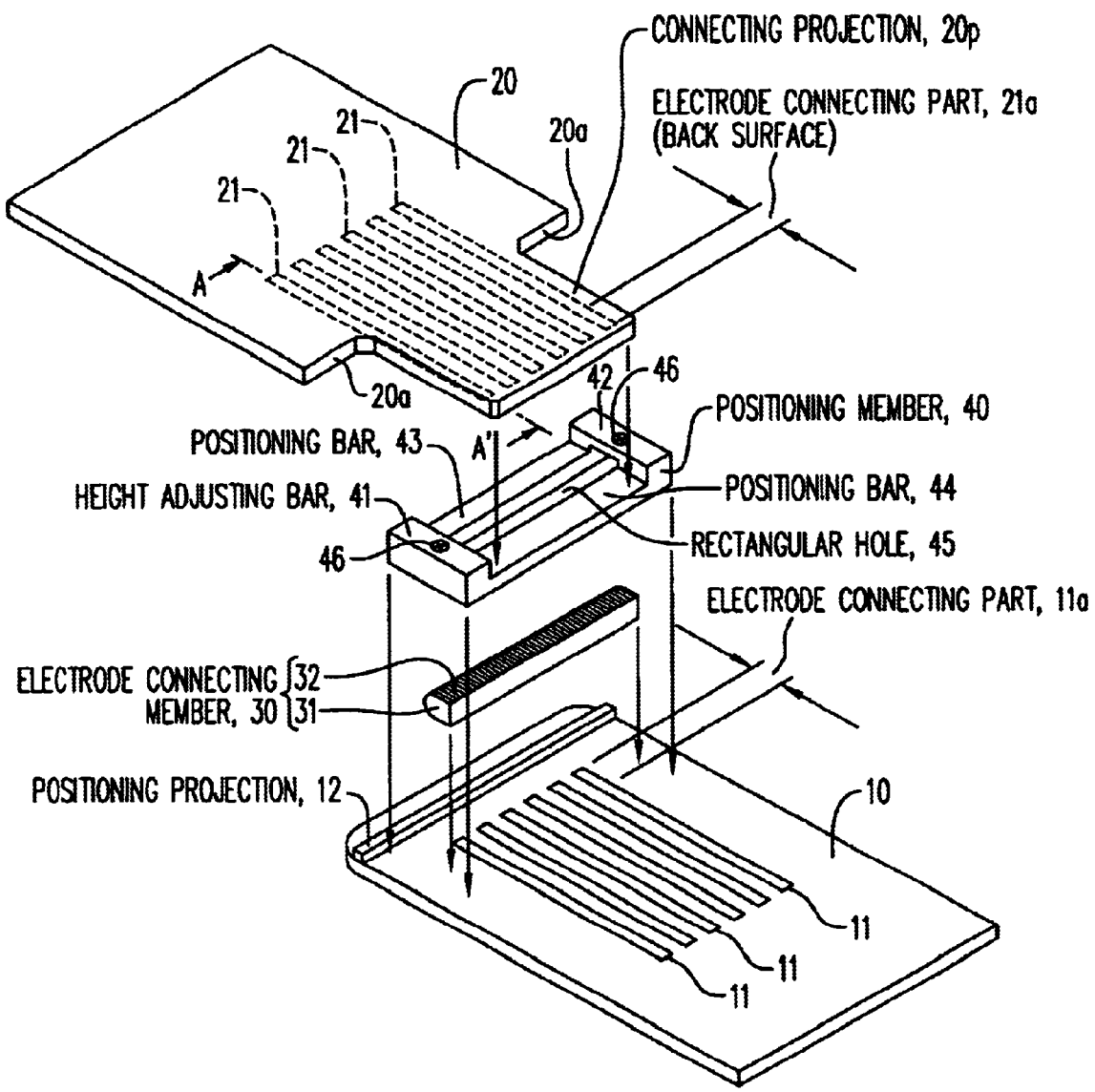
FIG. 1 is an exploded perspective view showing a configuration of a connecting apparatus for providing electrical connection between respective electrodes 11 and 21 of two high-frequency circuit boards 10 and 20 according to a preferred embodiment of the present invention.
Figure 2:
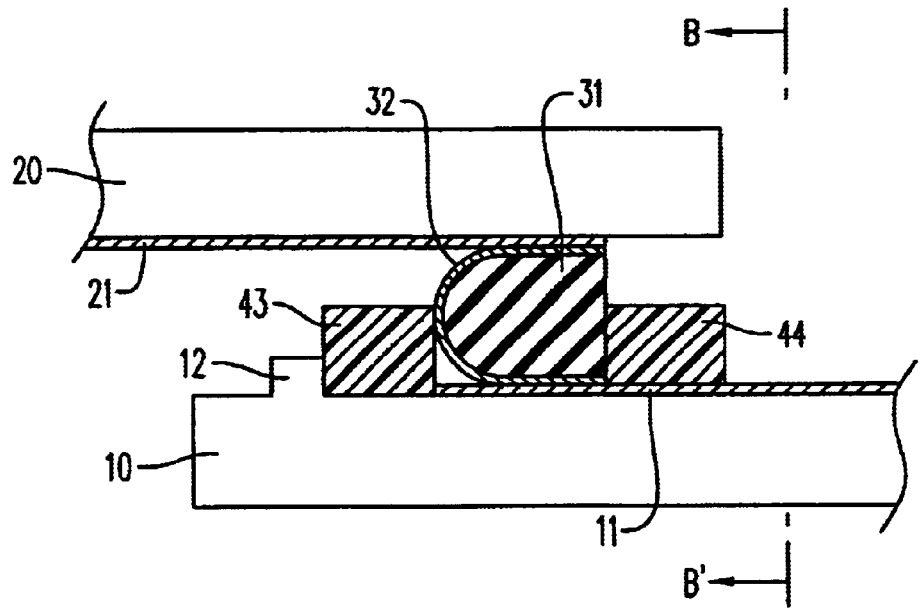
FIG. 2 is a cross sectional view taken along the line A–A' of FIG. 1.
Figure 3:
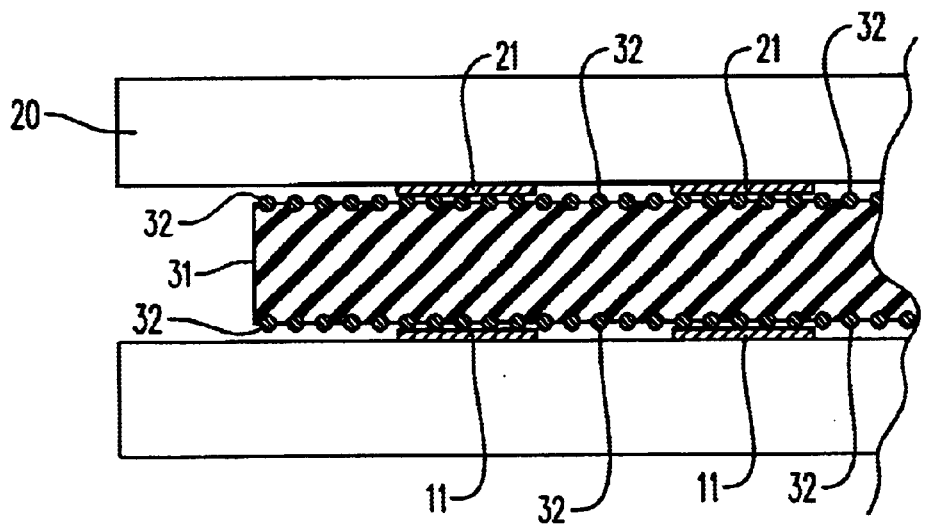
FIG. 3 is a cross sectional view taken along the line B–B' of FIG. 2, virtually excluding a positioning bar 44.

FIG. 1 is an exploded perspective view showing a configuration of a connecting apparatus for providing electrical connection between respective electrodes 11 and 21 of two high-frequency circuit boards 10 and 20 according to a preferred embodiment of the present invention. FIG. 2 is a cross sectional view taken along the line A–A' of FIG. 1. FIG. 3 is a cross sectional view taken along the line B–B' of FIG. 2, virtually excluding a positioning bar 44.

Referring to FIG. 1, the apparatus for connecting high-frequency circuit boards according to the preferred embodiment is implemented for providing electrical connection between the respective electrodes 11 and 21 of the two high-frequency circuit boards 10 and 20. The apparatus of the preferred embodiment is characterized by comprising an electrode connecting member 30 including a bar or cylinder-shaped member 31 and connecting electrodes 32. The bar-shaped member 31 has a sectional shape formed of a combination of a semicircular part and a rectangular part in such a manner that a diameter of the semicircular part is in close contact with one side of the rectangular part. The connecting electrodes 32 are formed on an outer periphery of the bar-shaped member 31, concretely formed on at least an arc of the semicircular or elliptic part of the bar-shaped member 31 and two sides of the rectangular part in close contact with the ends of the arc. In this case, the connecting electrodes 32 are located so as to provide inter-connection between the respective electrodes 11 and 21 of the two high-frequency circuit boards 10 and 20, through the connecting electrodes 32, and to be sandwiched between the respective electrodes 11 and 21 thereof. In the preferred embodiment, the apparatus thereof is characterized in that the connecting electrodes 32 are constituted by a plurality of electrode lines which are spaced at a predetermined very fine interval on the outer periphery of the bar-shaped member 31. Further, the apparatus thereof preferably further comprises a positioning member 40 for positioning the electrode connecting member 30 between the two high-frequency circuit boards 10 and 20 so that the connecting electrodes 32 may provide inter-connection between the respective electrodes 11 and 21 of the two high-frequency circuit boards 10 and 20, through the connecting electrodes 32, and may be sandwiched between the respective electrodes 11 and 21 thereof.

The preferred embodiment relates to an apparatus or a method for connecting two high-frequency circuit boards 10 and 20 separated physically, which is in particularly used at a place to be detached and attached with high frequency while maintaining high-frequency characteristics in (a) a magnetic head that is a component of a hard disk drive unit, (b) a read and write tester, and (c) a media tester for measuring electrical characteristics of media. Also included is an apparatus or a method using a DUT (a device under test) to be frequently replaced in a test fixture of the other high-frequency measuring apparatuses.

First of all, the configuration of the apparatus for connecting the high-frequency circuit boards 10 and 20 shown in FIGS. 1 to 3 will be described in detail below.

Referring to FIG. 1, a plurality of strip electrodes 21 each having a predetermined width are formed on a back surface of one high-frequency circuit board 20 in such a manner that the electrodes 21 extend to a connecting projection 20p of the high-frequency circuit board 20 and are spaced at a predetermined interval and located parallel to a long side of the high-frequency circuit board 20. In the preferred embodiment, the ends of a plurality of electrodes 21 form electrode connecting parts 21a. On the other hand, a plurality of strip electrodes 11 each having the same width as that of the above-mentioned electrode 21 are formed on a front surface of the other high-frequency circuit board 10 in such a manner that the electrodes 11 are spaced at a predetermined interval, which is the same as the interval between the respective electrodes 21, and that the respective electrodes 11 are located so as to oppose the electrodes 21 and to be in parallel to a long side of the high-frequency circuit board 10. In the preferred embodiment, the ends of a plurality of electrodes 11 form electrode connecting parts 11a. A positioning projection 12, which projects from the front surface of the high-frequency circuit board 10 and extends in a direction parallel to a short side of the high-frequency circuit board 10, is formed at a predetermined distance from the end of each electrode connecting part 11a between the end of each electrode connecting part 11a and the short side of the high-frequency circuit board 10.

In the preferred embodiment, the electrode connecting member 30 is sandwiched between the electrode connecting parts 11a and 21a of the two high-frequency circuit boards 10 and 20, and the above-mentioned electrode connecting member 30 is positioned relative to the positioning projection 12 by means of the positioning member 40.

The electrode connecting member 30 may be called an inter-connector, and comprises the bar-shaped member 31 in a form of a housing, which has the sectional shape formed of the combination of the semicircular part and the rectangular part in such a manner that the diameter of the semicircular part is in close contact with one side of the rectangular part as shown in FIGS. 1 to 3, where the bar-shaped member 31 is made of an elastomeric material such as an elastomer, for example, silicone rubber, sponge rubber or the like. The connecting electrodes 32, which are constituted by a plurality of electrode lines made of extra-fine wires each having a diameter of, for example, 0.025 mm, are formed at a high density by means of bonding or the like on the outer periphery of the bar-shaped member 31, and in particular, are formed on at least the arc of the semicircular part of the bar-shaped member 31 and two sides of the rectangle in close contact with the ends of the arc in such a manner that the connecting electrodes 32 are formed substantially in parallel to a cross section of the bar so as to be spaced at a predetermined interval of, for instance, 0.025 mm. In an experimental example made by the inventors, the width of each connecting electrode 32 is about 1 mm, and the connecting electrodes 32 that are of twenty extra-fine wires are in contact with each one electrode 11 or 21. Preferably, ten or more connecting electrodes 32 are in contact with each one electrode 11 or 21 in order to relax positioning accuracy and ensure more improved electrical characteristics.

The positioning member 40 may be called an inter-connector guide and is constituted by two rectangular-bar-shaped height adjusting bars 41 and 42 located at the ends thereof, and two rectangular-bar-shaped positioning bars 43 and 44 for coupling the height adjusting bars 41 and 42. The height adjusting bars 41 and 42 are configured so that the height of each thereof is greater than that of each of the positioning bars 43 and 44. A longitudinal length of each of the positioning bars 43 and 44 is set so as to be substantially equal to a length of one side of the end of the connecting projection 20p of the high-frequency circuit board 20. Thus, the connecting projection 20p can be placed at a space, which is located between opposing or facing two inner surfaces of the height adjusting bars 41 and 42 and which is also located on the top surfaces of the positioning bars 43 and 44. A rectangular hole 45 for mounting and positioning the electrode connecting member 30 is formed in a height direction so as to pass through a space surrounded by the height adjusting bars 41 and 42 and the positioning bars 43 and 44. In the preferred embodiment, the rectangular hole 45 extends into the bottom portions of the height adjusting bars 41 and 42, and lower portions including the bottom portions of the height adjusting bars 41 and 42 are bored upward in the lower portions into which the rectangular hole 45 extends. In other words, each of the height adjusting bars 41 and 42 has a shape of an inverted U. Since the electrode connecting member 30 is thicker than the positioning bars 43 and 44, the electrode connecting member 30 is compressed by both the high-frequency circuit boards 10 and 20 during assembling of the high-frequency circuit boards 10 and 20.

Referring to FIG. 2, the positioning member 40 is placed on the front surface of the high-frequency circuit board 10 in such a manner that a backward long side of the positioning member 40 shown in FIG. 1 is in close contact with a long side of the positioning projection 12, and then, the positioning member 40 is positioned and screwed to the high-frequency circuit board 10, respectively, in the centers of the height adjusting bars 41 and 42. Thereafter, the electrode connecting member 30 is contained in the rectangular hole 45 in such a manner that the circular outer periphery thereof faces or opposes the positioning projection 12. Further, the connecting projection 20p of the high-frequency circuit board 20 is placed on the positioning bars 43 and 44 of the positioning member 40 in such a manner that a surface 20a at heels or roots of the connecting projection 20p is in close contact with backward surfaces of the height adjusting bars 41 and 42 shown in FIG. 1. At this time, the electrodes 21 of the high-frequency circuit board 20 are in contact with and electrically connected to the connecting electrodes 32 of the electrode connecting member 30, whereas the electrodes 11 of the high-frequency circuit board 10 are in contact with and electrically connected to the connecting electrodes 32 of the electrode connecting member 30. In the preferred embodiment, the electrodes 21 of the high-frequency circuit board 20 face or oppose the electrodes 11 of the high-frequency circuit board 10, so that respective electrodes 21 of the high-frequency circuit board 20 are electrically connected to respective corresponding electrodes 11 of the high-frequency circuit board 10, respectively, through the connecting electrodes 32 of the electrode connecting member 30 as shown in FIG. 3.

Figure 4:
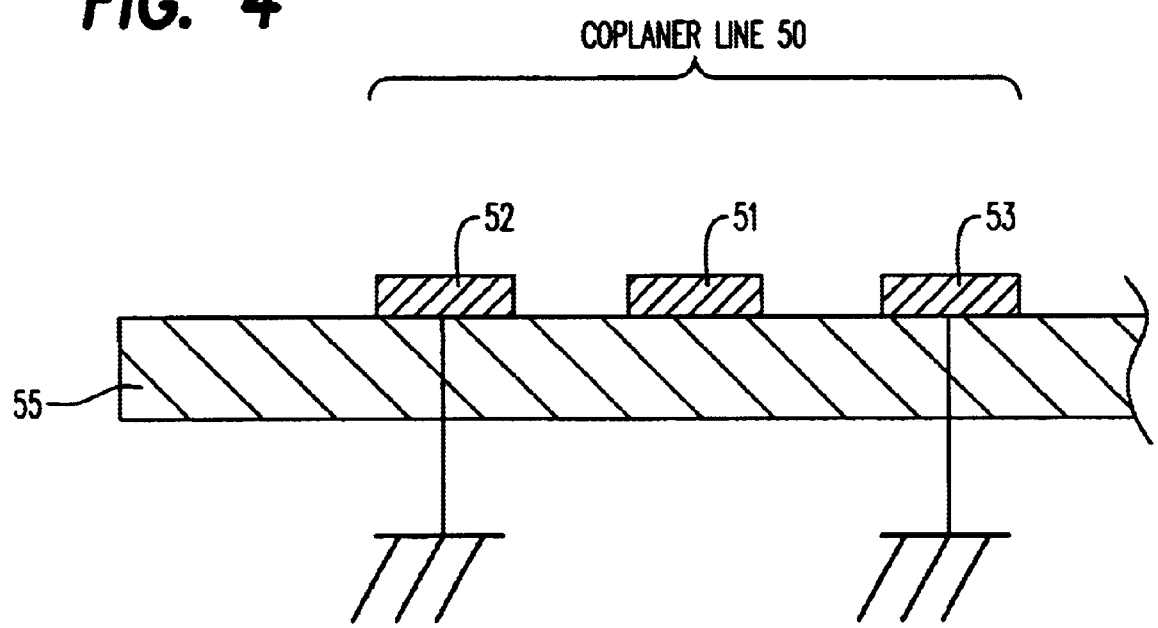
FIG. 4 is a cross sectional view showing a schematic configuration of a coplanar line 50 formed by the preferred embodiment.

In the preferred embodiment, among a plurality of connecting electrodes 32 of the electrode connecting member 30, only the connecting electrodes 32 that are in contact with and electrically connected to the electrodes 21 of the high-frequency circuit board 20 and the electrodes 11 of the high-frequency circuit board 10 are used as shown in FIG. 3. Since the used connecting electrodes 32 are of the electrode lines made of the extra-fine wires, a coplanar line 50, which is constituted by a central conductor 51 on a dielectric board 55 and two grounding conductors 52 and 53 formed at a predetermined distance from the central conductor 51 on both sides of the central conductor 51, is substantially configured as shown in FIG. 4, for example, when three electrodes 21 of the high-frequency circuit board 20 are electrically connected to three electrodes 11 of the high-frequency circuit board 10 through the connecting electrodes 32 in use.

In the apparatus for connecting high-frequency circuit boards configured as described above, the width of connection of the connecting electrodes 32 of the electrode connecting member 30 is determined according to the widths of patterns of the electrodes 11 and 21 of the high-frequency circuit boards 10 and 20, and therefore the connecting method causes much less reflection. Furthermore, for example, as shown in FIG. 4, a high-frequency connecting circuit has a structure of coplanar line, and the characteristic impedance of the coplanar line is substantially matched to the characteristic impedances of the electrodes 11 and 21, so that the high-frequency characteristics can be greatly improved as compared with the high-frequency characteristics of the prior art. Moreover, because of multi-point contact rather than one-point contact for contact probes 90 of the prior art, a contact load per contact area is low, and therefore, not only the load to be applied to the electrode connecting member 30 but also the load to be applied to the electrodes 11 and 21 formed on the high-frequency circuit boards 10 and 20 is also low, so that the preferred embodiment is advantageous in longevity.

Furthermore, the prior art requires a jig for removing the contact probes 90, however, the preferred embodiment allows easily replacing the electrode connecting member 30 or the like with its repairing part by removing only screws 46 without any use of the jig or the like. Moreover, one electrode connecting member 30 can connect a plurality of contact points, so that a cost per connecting point is low. Additionally, the replacement of the electrode connecting member 30 is also easy, so that the electrode connecting member 30 can be periodically replaced for preventive maintenance of facilities.

Still further, the patterns of the electrodes 11 and 21 of the high-frequency circuit boards 10 and 20 according to the preferred embodiment do not need any electrode connecting parts 11a and 21a called pads, so that the patterns of the electrodes 11 and 21 can be provided with a smaller pitch as compared with those of the prior art, and therefore, even inter-connection using the electrode connecting member 30 can be provided with a smaller pitch.

Still further, the preferred embodiment facilitates a mixture of (a) high-frequency connection using a structure similar to the structure of the coplanar line shown in FIG. 4, for example, and (b) DC and low-frequency connections, and therefore, this allows flexible designing of high-frequency circuit boards.

In the above-described preferred embodiment, the bar-shaped member 31 has the sectional shape formed of the combination of the semicircular part and the rectangular part in such a manner that the diameter of the semicircular part is in close contact with one side of the rectangular part, however, the present invention is not limited to this. The semicircular part may be replaced by a half of elliptic part. Alternatively, the bar-shaped member 31 may have a predetermined sectional shape such as a rectangular shape, a trapezoidal shape, a hexagonal shape or various polygonal shapes, and the connecting electrodes 32 may be formed on a part of the outer periphery of the bar-shaped member 31.

In the above-described preferred embodiment, the dielectric boards of the high-frequency circuit boards 10 and 20 may be made of an FPC (flexible printed wiring board) material.

First Modified Preferred Embodiment

Figure 5A:
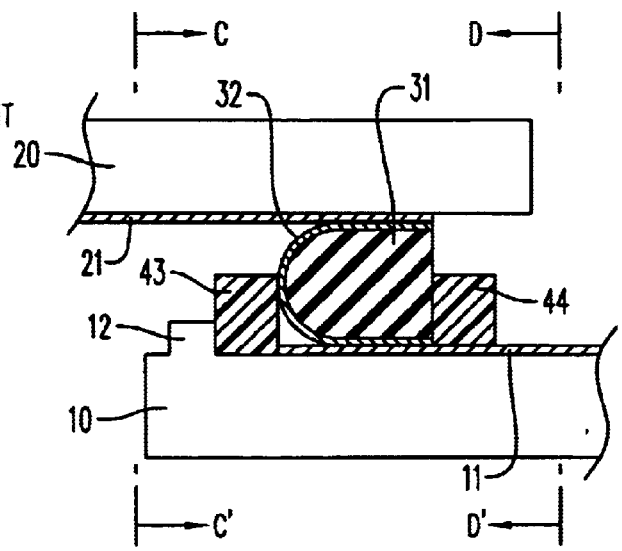
FIG. 5A is a cross sectional view (corresponding to FIG. 2) showing a configuration of a connecting apparatus for providing electrical connection between the respective electrodes 11 and 21 of the two high-frequency circuit boards 10 and 20 according to a first modified preferred embodiment of the present invention.
Figure 5B:
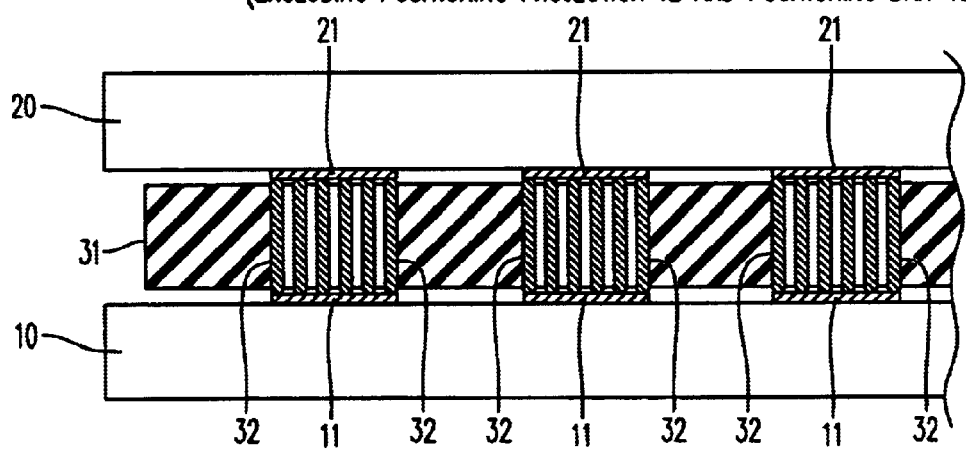
FIG. 5B is a cross sectional view taken along the line C–C' of FIG. 5A, virtually excluding a positioning projection 12 and a positioning bar 43.
Figure 5C:
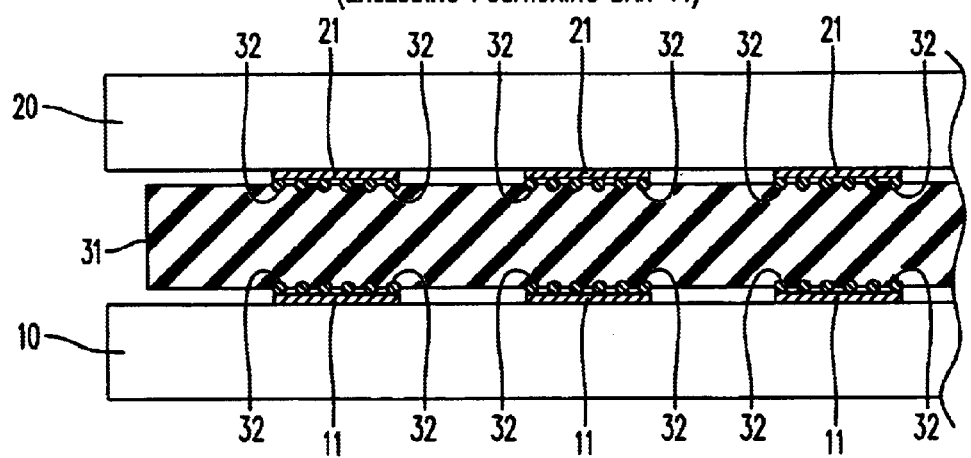
FIG. 5C is a cross sectional view taken along the line D–D' of FIG. 5A, virtually excluding the positioning bar 44.

FIG. 5A is a cross sectional view (corresponding to FIG. 2) showing a configuration of a connecting apparatus for providing electrical connection between the respective electrodes 11 and 21 of the two high-frequency circuit boards 10 and 20 according to a first modified preferred embodiment of the present invention. FIG. 5B is a cross sectional view taken along the line C–C' of FIG. 5A, virtually excluding the positioning projection 12 and the positioning bar 43. FIG. 5C is a cross sectional view taken along the line D–D' of FIG. 5A, virtually excluding the positioning bar 44.

In the first modified preferred embodiment, a plurality of connecting electrodes 32 are formed so as to be spaced only at a predetermined interval corresponding to the interval between the respective electrodes 11 and the same interval between the respective electrodes 21 of the two high-frequency circuit boards 10 and 20. Then, the connecting electrodes 32 constitute a plurality of sets of connecting electrodes, each set of which is formed of a plurality of electrode lines, which are formed with a predetermined smaller pitch on the outer periphery of the bar-shaped member 31 and are made of extra-fine wires. As shown in FIGS. 5A, 5B and 5C, the pitch of the electrode lines is extremely smaller than the interval between the respective electrodes 11 and the interval between the respective electrodes 21 which are substantially the same as each other. That is, in the first modified preferred embodiment, the connecting electrode 32 is not formed in parts on the bar-shaped member 31, corresponding to portions in which the electrodes 11 and 21 are not formed.

The first modified preferred embodiment configured as described above has the same functions and advantageous effects as those of the above-mentioned preferred embodiment, except that the positions, at which the connecting electrodes 32 of the electrode connecting member 30 are formed, are made to correspond to the patterns of the electrodes 11 and 21 of the two high-frequency circuit boards 10 and 20.

Second Modified Preferred Embodiment

Figure 6A:
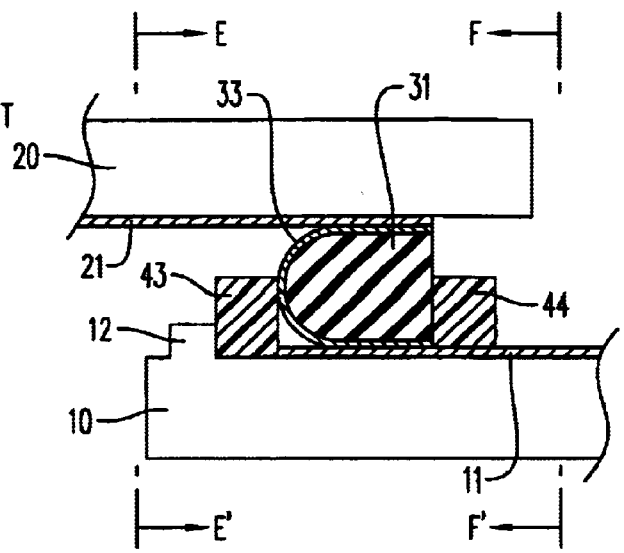
FIG. 6A is a cross sectional view (corresponding to FIG. 2) showing a configuration of a connecting apparatus for providing electrical connection between the respective electrodes 11 and 21 of the two high-frequency circuit boards 10 and 20 according to a second modified preferred embodiment of the present invention.
Figure 6B:
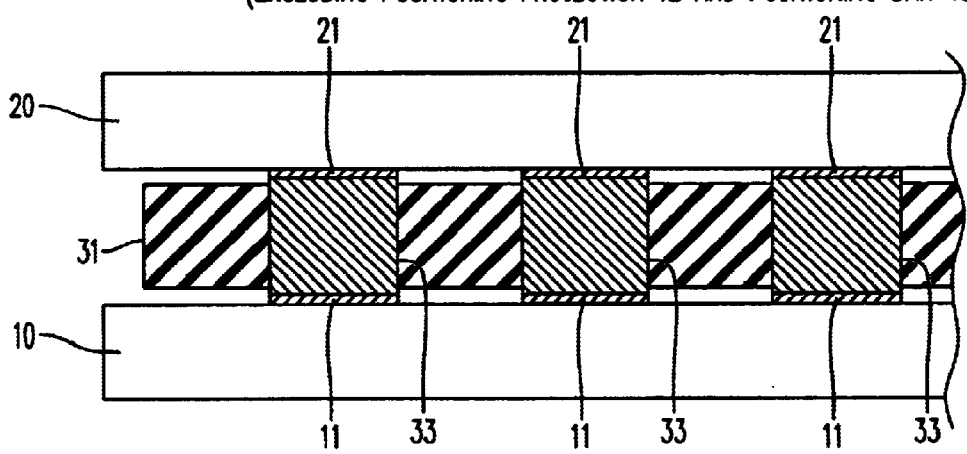
FIG. 6B is a cross sectional view taken along the line E–E' of FIG. 6A, virtually excluding the positioning projection 12 and the positioning bar 43.
Figure 6C:
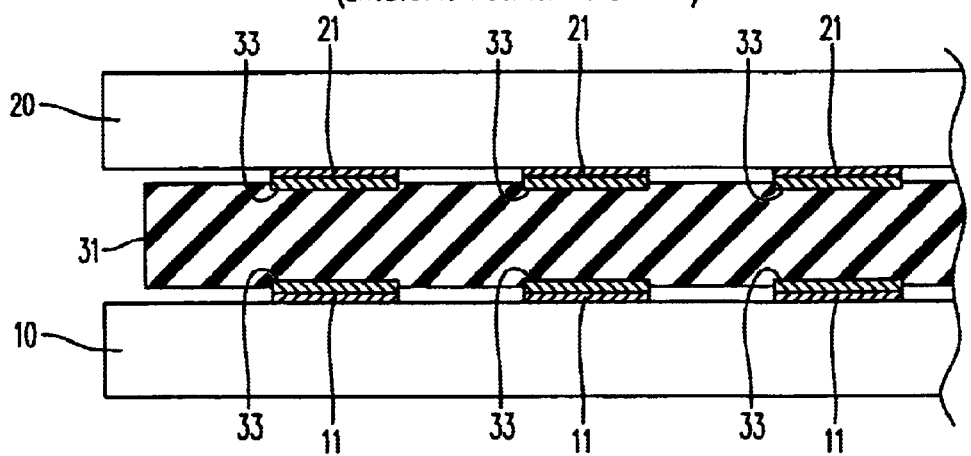
FIG. 6C is a cross sectional view taken along the line F–F' of FIG. 6A, virtually excluding the positioning bar 44.
Figure 7:
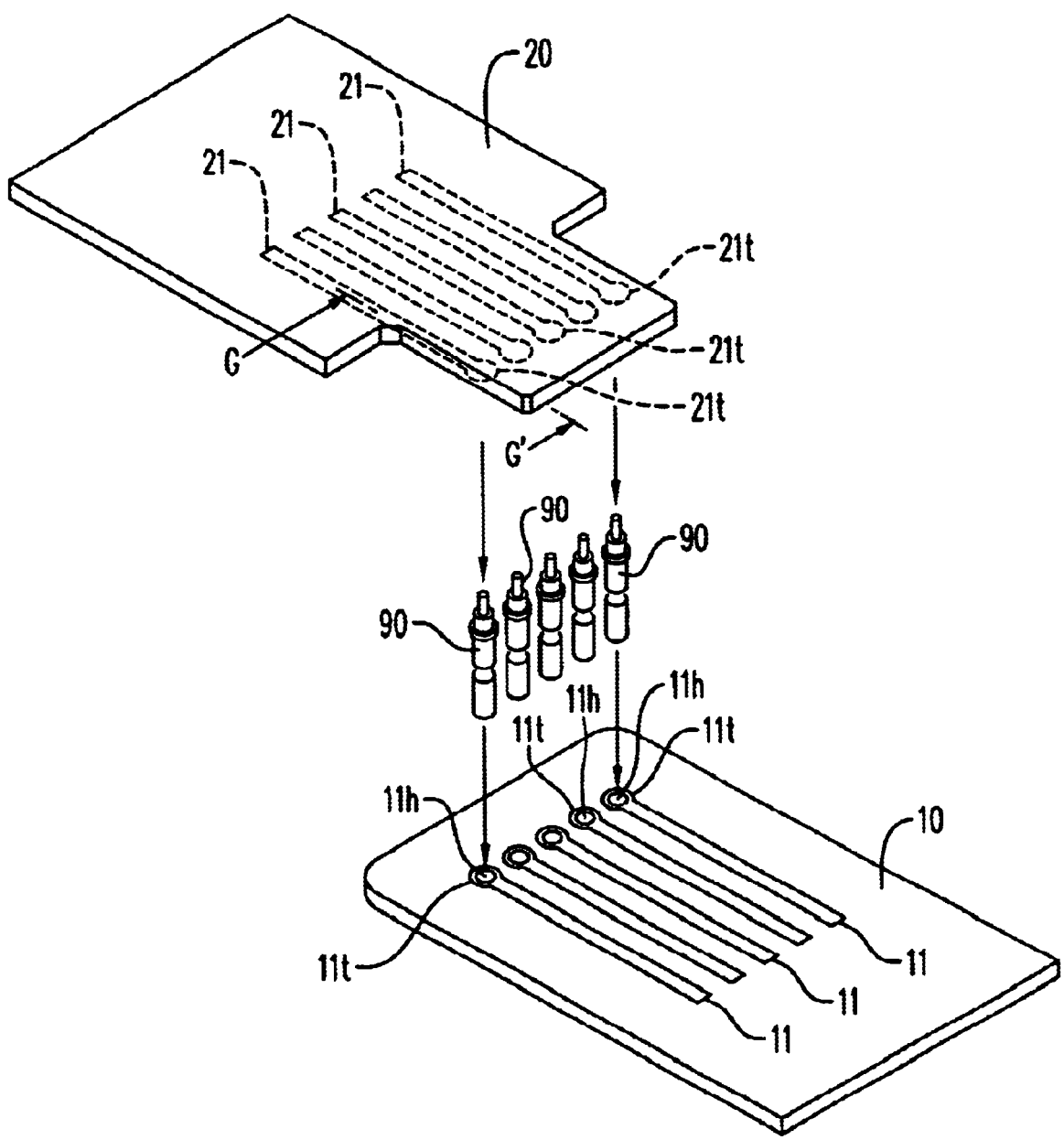
FIG. 7 is an exploded perspective view showing a configuration of a connecting apparatus of a prior art for providing electrical connection between the respective electrodes 11 and 21 of the two high-frequency circuit boards 10 and 20.
Figure 8:
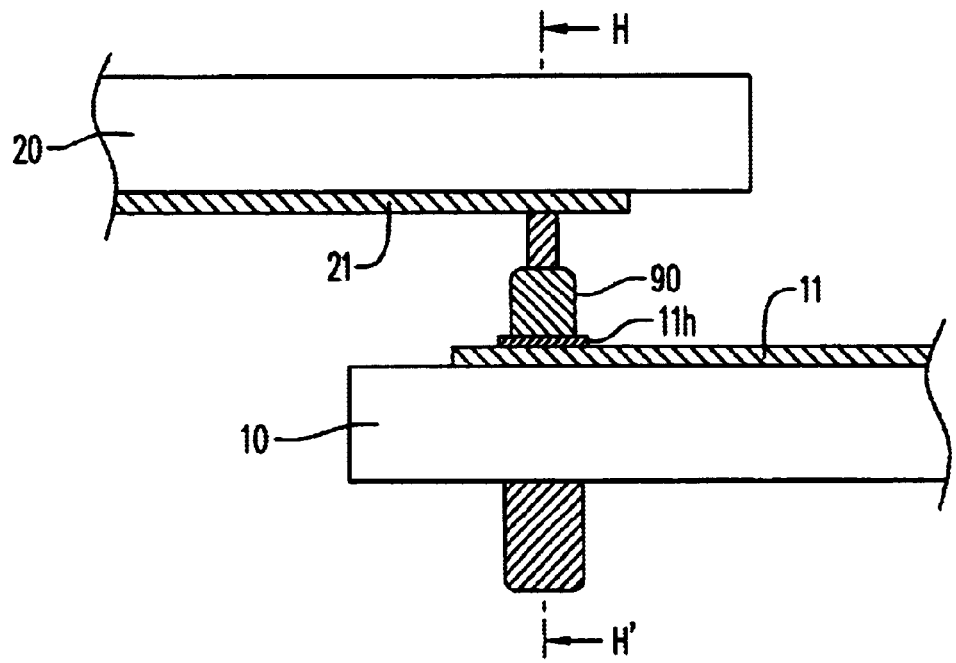
FIG. 8 is a cross sectional view taken along the line G–G' of FIG. 7.
Figure 9:
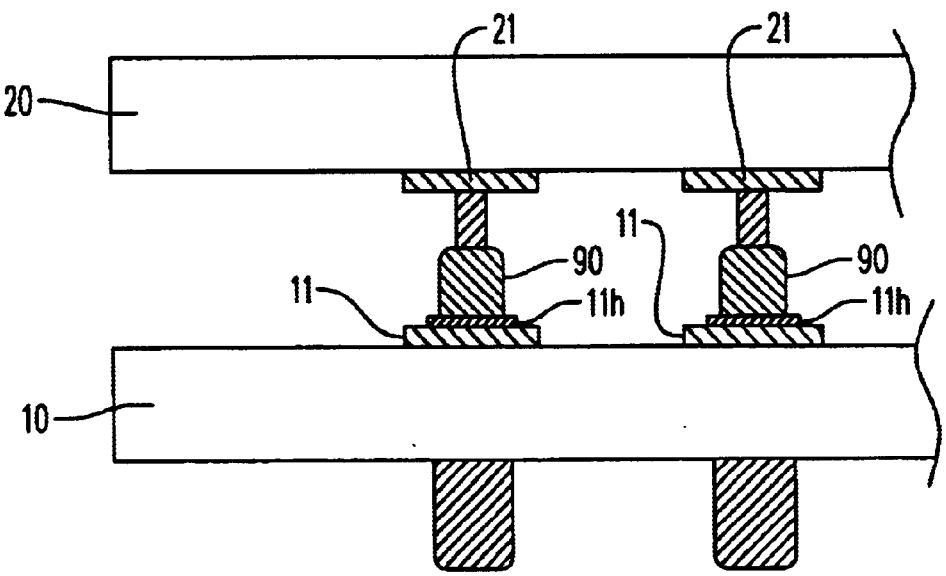
FIG. 9 is a cross sectional view taken along the line H–H' of FIG. 8.

FIG. 6A is a cross sectional view (corresponding to FIG. 2) showing a configuration of a connecting apparatus for providing electrical connection between the respective electrodes 11 and 21 of the two high-frequency circuit boards 10 and 20 according to a second modified preferred embodiment of the present invention. FIG. 6B is a cross sectional view taken along the line E–E' of FIG. 6A, virtually excluding the positioning projection 12 and the positioning bar 43. FIG. 6C is a cross sectional view taken along the line F–F' of FIG. 6A, virtually excluding the positioning bar 44.

The second modified preferred embodiment is characterized in that the connecting electrodes 32 of the first modified preferred embodiment, which are formed of the electrode lines made of the extra-fine wires, are replaced by connecting electrodes 33 formed of planner solid electrodes made of a conductor such as Au, Cu or the like. That is, there are formed a plurality of connecting electrodes 33, each of which is of wider planar solid electrode, so as to be spaced at a predetermined interval corresponding to the interval between the respective electrodes 11 and the same interval between the respective electrodes 21 of the two high-frequency circuit boards 10 and 20.

The second modified preferred embodiment configured as described above has the same functions and advantageous effects as those of the above-mentioned preferred embodiment, except that the positions, at which the connecting electrodes 33 of the electrode connecting member 30 are formed, are made to correspond to the patterns of the electrodes 11 and 21 of the two high-frequency circuit boards 10 and 20.

Advantageous Effects of Preferred Embodiments

As described in detail above, according to the preferred embodiments of the present invention, there is provided an apparatus and method for connecting high-frequency circuit boards 10 and 20, for providing electrical connection between the respective electrodes 11 and 21 of two high-frequency circuit boards 10 and 20. The apparatus comprises an electrode connecting member 30 including a bar-shaped member 31 having a predetermined sectional shape, and including connecting electrodes 32 or 33 formed on a part of an outer periphery of the bar-shaped member 31. In this case, the connecting electrodes 32 or 33 are located so as to provide inter-connection between the respective electrodes 11 and 21 of the two high-frequency circuit boards 10 and 20 through the connecting electrodes 32 or 33 and to be sandwiched between the respective electrodes 11 and 21 thereof.

According to the present preferred embodiments of the present invention, it is therefore possible to provide the apparatus and method for connecting high-frequency circuit boards 10 and 20, which achieves less deterioration in high-frequency characteristics, a simpler structure, a smaller size, a lighter weight, a longer life and more inexpensiveness as compared with those of the prior art.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. An apparatus for providing electrical inter-connections between respective longitudinal electrodes of two high-frequency circuit boards, comprising:

an electrode connecting member comprising a bar-shaped member having a sectional shape, at least a section of said bar shaped member having a U-shaped outer periphery, and a connecting electrode formed on said U-shaped outer periphery, said connecting electrode comprising a plurality of longitudinal electrode lines, wherein said connecting electrode being located between said respective longitudinal electrodes of said two high-frequency circuit boards to provide said electrical inter-connection between said respective longitudinal electrodes of said two high-frequency circuit boards through said plurality of longitudinal electrode lines of said connecting electrode, such that said respective longitudinal electrodes of said two high-frequency circuit boards are substantially parallel to each other and to said plurality of longitudinal electrode lines of said connecting electrode.

2. The apparatus as claimed in claim 1, wherein said plurality of longitudinal electrode line are spaced at a predetermined interval on said U-shaped outer periphery of said electrode connecting member.

3. The apparatus as claimed in claim 1, wherein said longitudinal electrode line comprises a plurality of sets of connecting electrodes, respective sets of said connecting electrodes being formed on said outer periphery of said electrode connecting member spaced at a predetermined first interval corresponding to an interval between said respective longitudinal electrodes of each of said two high-frequency circuit boards, each of said plurality of sets of connecting electrodes comprising a plurality of electrode lines spaced at a predetermined second interval smaller than said predetermined first interval.

4. The apparatus as claimed in claim 1, wherein said plurality of longitudinal electrode lines comprises a plurality of planer solid electrodes being formed on said U-shaped outer periphery of said electrode connecting member spaced at a predetermined first interval corresponding to an interval between said respective electrodes of each of said two high-frequency circuit boards.

5. The apparatus as claimed in claim 1, further comprising:

a positioning member for positioning said electrode connecting member between said two high-frequency circuit boards so that said connecting electrode provides an inter-connection between said respective longitudinal electrodes of said two high-frequency circuit boards, said positioning member being sandwiched between said respective electrodes of said two high-frequency circuit boards.

6. The apparatus as claimed in claim 2, wherein said plurality of longitudinal electrode lines being arranged to comprise a structure of a coplanar line.

7. The apparatus as claimed in claim 1, wherein each of said plurality of longitudinal electrode lines comprises a plurality of fine wires.

8. The apparatus as claimed in claim 2, wherein each of said plurality of longitudinal electrode lines comprises a plurality of fine wires.

9. The apparatus as claimed in claim 3, wherein each of said plurality of longitudinal electrode lines comprises a plurality of fine wires.

* * * * *